(12) United States Patent
Lutkemeyer (10) Patent No.: US 7,177,894 B2
(45) Date of Patent: Feb. 13, 2007

(54) SWITCHING ACTIVITY REDUCED CODING FOR LOW-POWER DIGITAL SIGNAL PROCESSING CIRCUITRY

(75) Inventor: Christian Lutkemeyer, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 692 days.

(21) Appl. No.: 10/650,641

(22) Filed: Aug. 28, 2003

(65) Prior Publication Data

US 2005/0050133 A1    Mar. 3, 2005

(51) Int. Cl.
  *G06F 7/52*    (2006.01)
(52) U.S. Cl. ...................... 708/620; 708/628
(58) Field of Classification Search ............... 708/620, 708/625, 628
  See application file for complete search history.

(56) References Cited

U.S. PATENT DOCUMENTS

| | | | |
|---|---|---|---|
| 5,384,786 A | * | 1/1995 | Dudley et al. .............. 714/784 |
| 5,442,775 A | * | 8/1995 | Whitted et al. ............. 713/601 |
| 5,666,497 A | * | 9/1997 | Milhaupt et al. ........... 710/305 |
| 5,974,259 A | * | 10/1999 | Casal et al. ................. 713/300 |

OTHER PUBLICATIONS

Chris J. Nicol and Patrik Larsson; "Low Power Multiplication for FIR Filters;" 1997, pp. 76-79.

\* cited by examiner

*Primary Examiner*—Chuong D. Ngo
(74) *Attorney, Agent, or Firm*—McAndrews, Held & Malloy, Ltd.

(57) ABSTRACT

A system and method for reducing power consumption in digital circuitry by reducing the amount of unnecessary switching in such circuitry. An aspect of the present invention provides a switching-reduction circuit that outputs a signal to a subsequent digital circuit. The value of the signal may depend on the relevance of the signal value to a next output of the subsequent digital circuit. A method according to various aspects of the present invention includes receiving a next input signal. The method further includes determining whether the next input signal may be relevant to a next output of a subsequent digital circuit. The method further includes providing the next input signal to the subsequent digital circuit when the next input signal may be relevant to the next output of the subsequent digital circuit, and providing a previous signal to the subsequent digital circuit when the next input signal will not be relevant to the next output of the subsequent digital circuit.

30 Claims, 6 Drawing Sheets

| x[k] | k<br>-2 | k+1<br>0 | k+2<br>-2 | k+3<br>-1 | k+4<br>0 | Signal Transitions |
|---|---|---|---|---|---|---|
| Baseline Code 710 | | | | | | |
| S2[k] | | | | | | 3 |
| Zero[k] | | | | | | 3 |
| S0[k] | | | | | | 2 |
| New Code 720 | | | | | | |
| S2[k] | | | | | | 0 |
| Zero[k] | | | | | | 3 |
| S0[k] | | | | | | 1 |

SWITCHING ACTIVITY REDUCED CODING FOR LOW-POWER DIGITAL SIGNAL PROCESSING CIRCUITRY

CROSS-REFERENCE TO RELATED APPLICATIONS/INCORPORATION BY REFERENCE

[Not Applicable]

FEDERALLY SPONSORED RESEARCH OR DEVELOPMENT

[Not Applicable]

[SEQUENCE LISTING]

[Not Applicable]

[MICROFICHE/COPYRIGHT REFERENCE]

[Not Applicable]

FIELD OF THE INVENTION

The present invention relates generally to reducing power consumption in digital circuitry. The present invention relates more specifically to using intelligent pre-coding to reduce switching, and therefore power consumption, in digital signal processing circuitry.

BACKGROUND OF THE INVENTION

Power consumption is a primary concern in many modern electrical circuits. A primary goal with many circuits is to make them as small as possible. Power consumption may limit the extent to which a circuit may be reduced in size. Another primary goal with many electrical circuits is to make circuits that can run longer with a limited supply of power, such as in portable products like cellular phones and portable computers. Power consumption limits the amount of time a portable device may operate with a limited supply of power. Therefore, there is a strong need in the art for methods and apparatus that reduce the amount of power consumed in electrical circuitry.

Engineers have developed various solutions to simplify digital signal processing circuitry. Such solutions often result in circuits with fewer devices, which often corresponds with lower power consumption. For example, engineers utilize Booth Coding in mathematical circuitry to reduce the number of mathematical operations that such circuitry must perform to get the desired result. Such coding provides for digital signal processing circuits that are smaller, faster, and generally lower power.

A problem with many, if not all, of such digital signal processing circuits is that the circuits perform unnecessary switching. Switching in digital circuitry is a primary source of power loss. Accordingly, an improvement in digital signal processing technology that reduces the amount of unnecessary switching will generally result in lower power consumption and all of the benefits that correspond to such lower power consumption. See, for example, "Low Power Multiplication for FIR Filters," by Chris J. Nicol and Patrick Larsson, ACM 0-89791-903-3/97/08. In their article, Nicol and Larsson offer a technique to reduce the switching activity in a multiplier by connecting the relatively stable coefficients of a filter response to the Booth encoded input of a multiplier rather than connecting other more random inputs.

Since, as discussed previously, there exists a strong need in the art for methods and apparatus that reduce the amount of power consumed in electrical circuitry, and there is often a correlation between the amount of switching required in circuitry and the amount of power consumed in such circuitry, there exists a strong need in the art for methods and apparatus that reduce the amount of switching in digital signal processing technology. Further, unnecessary switching not only results in unnecessary power consumption, but also results in unnecessary device wear and reduced life, thereby providing further incentive to develop methods and apparatus that reduce the amount of unnecessary switching in digital signal processing circuitry.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and method are provided for reducing power consumption in digital signal processing circuitry by reducing the amount of unnecessary switching in such circuitry. An aspect of the present invention includes a switching-reduction circuit that may include an output sub-circuit outputting a current output signal to a subsequent digital signal processing circuit. The switching-reduction circuit may also include a logic sub-circuit that receives a next input signal and determines whether the next input signal is relevant to a next output of the subsequent digital signal processing circuit. If the next input signal may be relevant to the next output of the subsequent digital signal processing circuit, the logic sub-circuit causes the output sub-circuit to output the next input signal to the subsequent digital signal processing circuit. If, however, the next input signal will not be relevant to the next output of the subsequent digital signal processing circuit, the logic sub-circuit causes the output sub-circuit to output again the current output signal to the subsequent digital signal processing circuit.

Another aspect of the present invention provides a method for reducing unnecessary switching in a subsequent digital circuit. The method may include outputting a current output signal to the subsequent digital circuit. The method may further include receiving a next input signal and determining, based on anticipated behavior of the subsequent digital circuit, whether the next input signal will be relevant to the next output of the subsequent digital circuit. If the next input signal may be relevant to the next output of the subsequent digital circuit, the method may include outputting the next input signal to the subsequent digital circuit. If, however, the next input signal will not be relevant to the next output of the subsequent digital circuit, the method may include outputting again the current output signal to the subsequent digital circuit.

These and other advantages, aspects and novel features of the present invention, as well as details of illustrative aspects thereof, will be more fully understood from the following description and drawings.

DETAILED DESCRIPTION OF THE INVENTION

Figure 1:
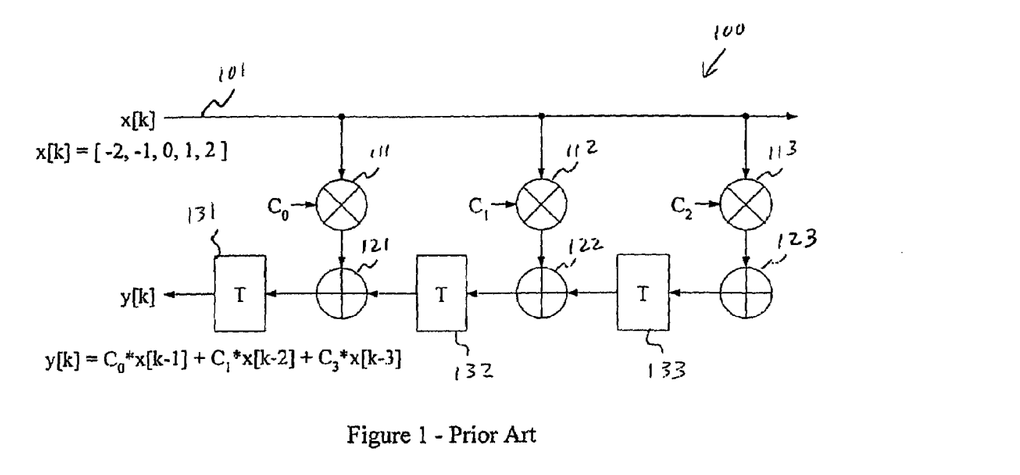
FIG. 1 is a diagram illustrating a traditional Finite Impulse Response (FIR) filter in a transposed configuration.

FIG. 1 is a diagram illustrating a traditional Finite Impulse Response (FIR) filter 100 in transposed form. The illustrated FIR filter 100 shows only three taps, but FIR filters may typically have a large number of taps. The input signal 101 (or "x") arrives at first, second and third coefficient multipliers 111–113, which multiply the input signal 101 by respective filter coefficients $C_0$, $C_1$ and $C_2$. A third adder circuit 123 adds the output of the third coefficient multiplier 113 to the results from further filter taps 125, not illustrated, which for this example are set to zero. A third delay element 133 receives the output of the third adder circuit 123 and delays the output of the third adder circuit 123 by one sample period.

A second adder circuit 122 adds the output of the second coefficient multiplier 112 to the output of the third delay element 133. A second delay element 132 receives the output of the second adder circuit 122 and delays, by one sample period, the output of the second adder circuit 122, which includes the output of the second coefficient multiplier 112 and the delayed output of the third coefficient multiplier 113.

A first adder circuit 121 adds the output of the first coefficient multiplier 111 to the output of the second delay element 132. A first delay element 131 receives the output of the first adder circuit 121 and delays, by one sample period, the output of the first adder circuit 121, which includes the output of the first coefficient multiplier 111 and the delayed output of second coefficient multiplier 112 and the twice-delayed output of the third coefficient multiplier 113.

The resulting output y[k] at a sample number "k" is thus equal to the previous input x[k−1] times the first coefficient $C_0$, plus the twice-previous input x[k−2] times the second coefficient $C_1$, plus the thrice-previous input x[k−3] times the third coefficient $C_2$. The resulting output equation for y[k] is shown in FIG. 1.

Figure 2:
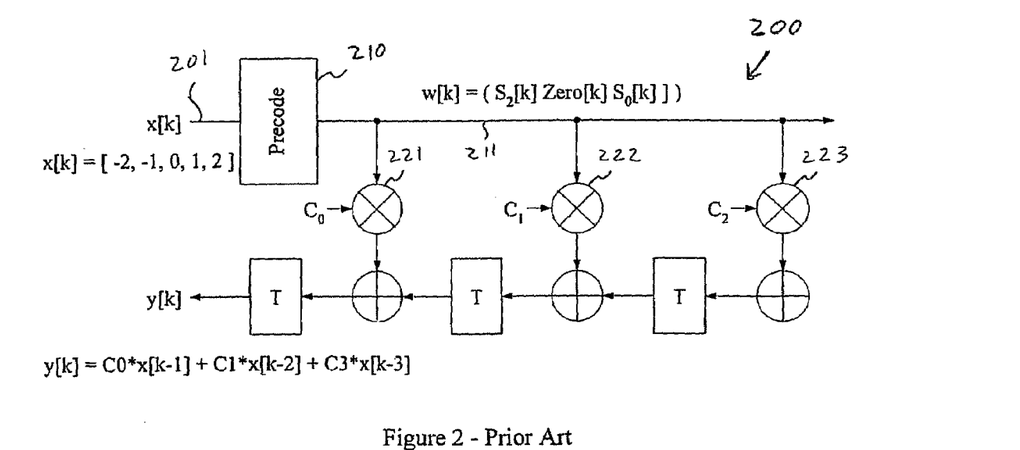
FIG. 2 is a diagram illustrating an FIR filter utilizing a pre-coding stage to simplify the subsequent mathematical computation circuitry.

FIG. 2 is a diagram illustrating an FIR filter 200 in transposed form and utilizing a pre-coding stage 210 to simplify the mathematical computation circuitry. The FIR filter 200 is similar to the FIR filter 100 of FIG. 1 at the block diagram level but may be quite different at the circuit schematic level. The input signal 201 (or "x") may assume a finite set of values. In the illustrated example, such values are limited to {−2, −1, 0, 1 and 2}. Such a finite set of values reduces the complexity of mathematics-performing circuitry. For example, limiting the value of the inputs of multiplication circuitry to the set {−2, −1, 0, 1 and 2} results in simplified multiplication circuitry that merely performs a one-bit shift, one's complement and/or zeroing operation. Such simplified multiplication circuitry may be utilized to implement the coefficient multipliers 221–223 of the FIR filter 200.

A precoder circuit 210 may enable simplification of subsequent mathematical circuitry. The precoder 210 receives the input signal 201 and codes the input signal 201 to yield a coded signal 211 (also labeled "w[k]"). In the example illustrated in FIG. 2, the coded signal 211, w[k] may be a 3-bit value denoted by the notation (symbol2[k] zero[k] symbol0[k]) or ($S_2$[k] Zero[k] $S_0$[k]). The precoder 210, or other circuitry, may use a variety of coding techniques to simplify the subsequent mathematics-performing circuitry. For example, the precoder 210 may use Booth encoding or many of the variants of Booth encoding. One such exemplary encoding strategy is illustrated in Table 1.

TABLE 1

Precode Logic Truth Table for 5-Level Symbol Code

| Symbol "x" (decimal) | Symbol "x" (two's complement - $x_2 x_1 x_0$) | Code $S_2$ (=$x_2$) | Code Zero (=$x_0$ or $x_1$ or $x_2$) | Code $S_0$ (=$x_0$) |
|---|---|---|---|---|
| −2 | 110 | 1 | 1 | 0 |
| −1 | 111 | 1 | 1 | 1 |
| 0 | 000 | 0 | 0 | 0 |
| 1 | 001 | 0 | 1 | 1 |
| 2 | 010 | 0 | 1 | 0 |

The Codes in Table 1 are related to the following signal processing mathematical operations:

$S_2$: If $S_2$=1, generate the one's complement;
Zero: If Zero=0, zero the result; and
$S_0$: If $S_0$=0, shift left one bit.

Figure 3:
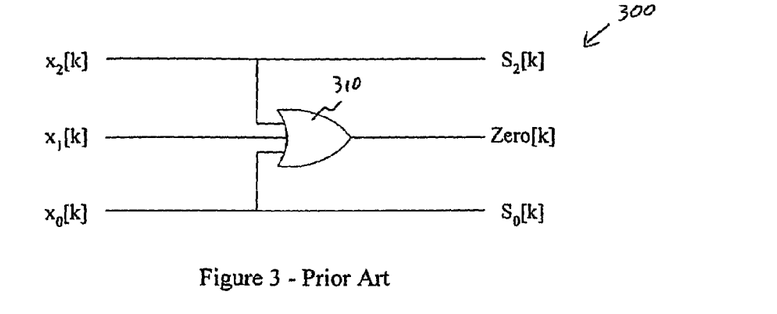
FIG. 3 is a diagram illustrating a pre-coding stage such as, for example, may be utilized in the FIR filter illustrated in FIG. 2.

FIG. 3 is a diagram illustrating a pre-coding stage 300 such as, for example, may be utilized in the FIR filter illustrated in FIG. 2 to implement the truth table shown in Table 1. Referring to FIG. 3, the precoder 300 codes output bit $S_2$ as input bit $x_2$ and output bit $S_0$ as input bit $x_0$. The precoder 300 utilizes an OR gate 310 to code output bit Zero as ($x_2$ or $x_1$ or $x_0$).

Figure 4:
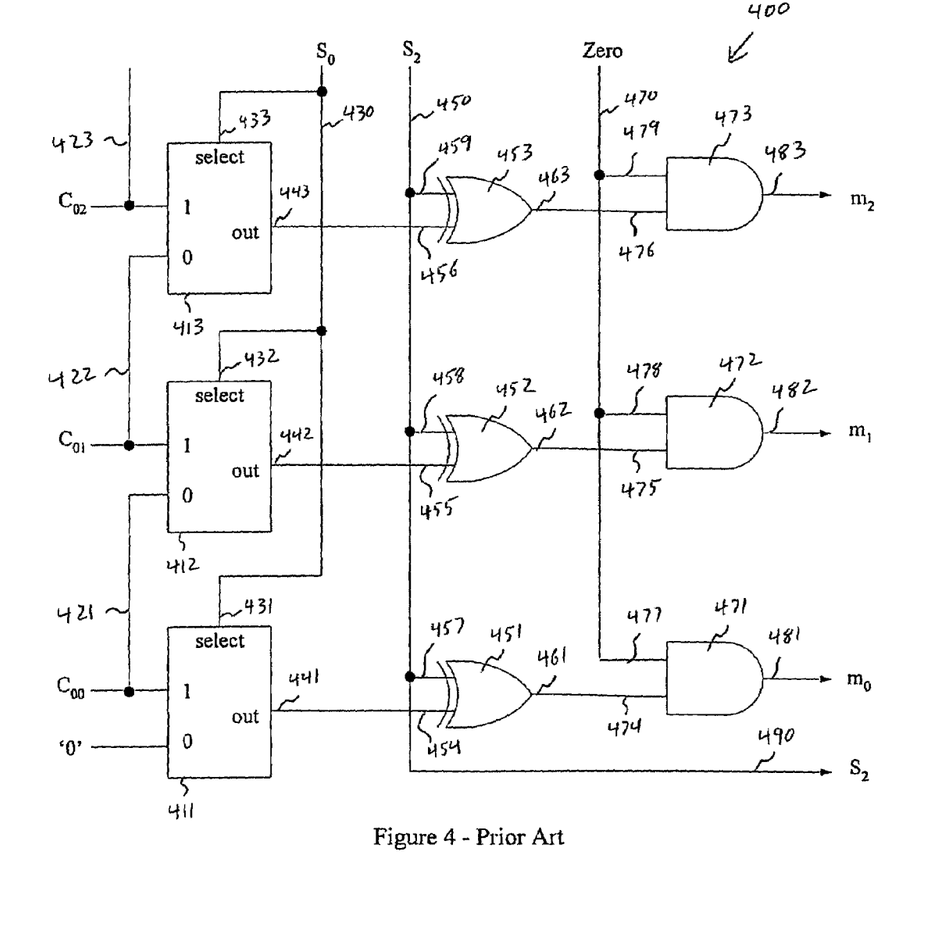
FIG. 4 is a diagram illustrating mathematical computation circuitry such as, for example, may accompany the FIR filter shown in FIG. 2.

FIG. 4 is a diagram illustrating a multiplier circuit 400 such as, for example, may be utilized in the FIR filter shown in FIG. 2. The multiplier circuit 400 may receive coded input signals ($S_0$, $S_2$ and Zero) from a precoder circuit such as, for example, the precoder circuit 300 illustrated in FIG. 3.

Referring to FIG. 4, the multiplier circuit 400 includes first, second and third multiplexers 411–413. The first multiplexer 411 receives a "0" input on input line 0 and a first multiplicand bit 421 on input line 1. The second multiplexer 412 receives the first multiplicand bit 421 on input line 0 and a second multiplicand bit 422 on input line 1. The third multiplexer 413 receives the second multiplicand bit 422 on input line 0 and a third multiplicand bit 423 on input line 1. The multiplexers 411–413 receive a selection signal 430 on respective selection lines 431–433.

When the selection signal 430 is a "0," the multiplexers 411–413 pass the signals present on their respective input line 0's to their respective outputs 441–443. When the selection signal 430 is a "1," the multiplexers 411–413 pass the signals present on their respective input line 1's to their respective outputs 441–443. Accordingly, the multiplexers 411–413 are configured to perform a one-bit left shift when the selection signal 430 is a "0" and to perform a signal pass-through operation when the selection signal 430 is a "1."

The multiplier circuit 400 also includes first, second and third exclusive-OR (XOR) gates 451–453. The first XOR gate 451 receives a first input 454 from the first multiplexer output 441 and a second input 457 from a one's complement signal 450. The second XOR gate 452 receives a first input 455 from the second multiplexer output 442 and a second input 458 from the one's complement signal 450. The third XOR gate 453 receives a first input 456 from the third multiplexer output 443 and a second input 459 from the one's complement signal 450. Accordingly, the XOR gates 451–453 implement a one's complement operation on their respective first inputs 454–456 governed by the one's complement signal 450 received on their respective second inputs 457–459.

When the one's complement signal 450 is a "0," the XOR gates 451–453 will present the signal received on their respective first inputs 454–456 to their respective outputs 461–463. Conversely, when the one's complement signal 450 is a "1," the XOR gates 451–453 will present the logical inverse of the signal received on their respective first inputs 454–456 on their respective outputs 461–463.

The multiplier circuit 400 further includes first, second and third AND gates 471–473, which function as a magnitude-zeroing sub-circuit. The first AND gate 471 receives a first input 474 from the first XOR gate output 461 and a second input 477 from a zeroing signal 470. The second AND gate 472 receives a first input 475 from the second XOR gate output 462 and a second input 478 from the zeroing signal 470. The third AND gate 473 receives a first input 476 from the third XOR gate output 463 and a second input 479 from the zeroing signal 470. Accordingly, the AND gates 471–473 perform a zeroing operation on their respective first inputs 474–476 governed by the zeroing signal 470 received on their respective second inputs 477–479.

When the zeroing signal 470 is a "0," the AND gates 471–473 will each present a "0" on their respective outputs 481–483. Conversely, when the zeroing signal 470 is a "1," the AND gates 471–473 will present the signal received on their respective first inputs 474–476 on their respective outputs 481–483. The AND gate outputs 481–483, combined with the output sign bit 490, which for this example is the one's complement signal 450, represent the output of the multiplier circuit 400.

For an exemplary utilization of the multiplier circuit 400, refer to FIG. 2 and FIG. 4. The multiplier circuit 400 may be utilized in the FIR filter 200 as one of the coefficient multipliers 221–223. For example, let the multiplier circuit 400 be utilized as the first coefficient multiplier 221. The first coefficient multiplier 221 receives coefficient $C_0$ as a multiplicand. For illustrative purposes, let the first coefficient $C_0$ be a 3-bit number represented by bits $[C_{02}\ C_{01}\ C_{00}]$, as labeled in FIG. 4. The first multiplicand bit 421 may be $C_{00}$, the second multiplicand bit 422 may be $C_{01}$, and the third multiplicand bit 423 may be $C_{02}$. Note, however, that the coefficients may be represented by any number of bits.

The selection signal 430 may, for example, be $S_0$ as output from the precoder 210 according to the truth table shown in Table 1. As mentioned previously, $S_0$ may be utilized to indicate a bit-shift left operation (i.e., a multiply by two). When $S_0$ is "1," the multiplexers 413–411 do not perform the shift left operation and accordingly output bits $[C_{02}\ C_{01}\ C_{00}]$, respectively. When $S_0$ is "0," the multiplexers 413–411 perform a one-bit left shift operation and accordingly output bits $[C_{01}\ C_{00}\ 0]$, respectively.

The one's complement signal 450 may, for example, be $S_2$ as output from the precoder 210 according to the truth table shown in Table 1. As mentioned previously, $S_2$ may be utilized to indicate a one's complement operation (i.e., a logical inversion). When $S_2$ is a "0," the XOR gates 451–453 do not perform the one's complement operation and accordingly output the signals received from the multiplexers 431–433 verbatim. When $S_2$ is a "1," the XOR gates 451–453 perform the one's complement operation and accordingly output the one's complement of the signals received from the multiplexers 431–433.

The zeroing signal 470 may, for example, be signal "Zero" as output from the precoder 210 according to the truth table shown in Table 1. As mentioned previously, signal Zero may be utilized to indicate a zeroing operation (i.e., a logical nullification). When signal Zero has a value of "0," the AND gates 471–473 perform the zeroing operation and accordingly output signals with a value of "0." When the signal Zero has a value of "1," the AND gates 471–473 do not perform the zeroing operation and accordingly output the signals received from the XOR gates 451–453.

Summarizing, in the exemplary configuration discussed above, the output of the multiplier circuit 400 is the input coefficient $C_0$ left bit-shifted according to $S_0$, then one's complemented according to $S_2$, and then zeroed according to the zeroing signal. Additionally, the multiplier circuit 400 also includes $S_2$ as the output sign bit 490.

An opportunity for improvement of the precoder 300 illustrated in FIG. 3 and the multiplier circuit 400 illustrated in FIG. 4 finds its basis in the fact that the multiplier circuit 400 may perform unnecessary switching operations. For example, the multiplexers 411–413 and XOR gates 451–453 respond to changing input signals, such as the selection signal 430 and the one's complement signal 450, by modifying their respective states, both internal and external. A zeroing signal 470 with a value of "0," however, drives the AND gates 471–473 to output levels of "0" for the magnitude outputs 481–483 of the multiplier circuit 400. This zeroing operation supercedes any switching operations in the multiplier circuit 400 caused by, for example, a changing selection signal 430 or changing one's complement signal 450. Since switching activity uses a substantial amount of electrical power, and since the switching operations in the multiplexers 411–413 and XOR gates 451–453 do not affect the output of the multiplier circuit 400 when the zeroing signal 470 has a value of "0," the switching activity is merely wasting power. In addition to wasting power, such unnecessary switching activity may also reduce the useful life of the multiplier circuit 400 and cause heating that is potentially damaging to the multiplier circuit 400 and other nearby circuits.

Figure 5:
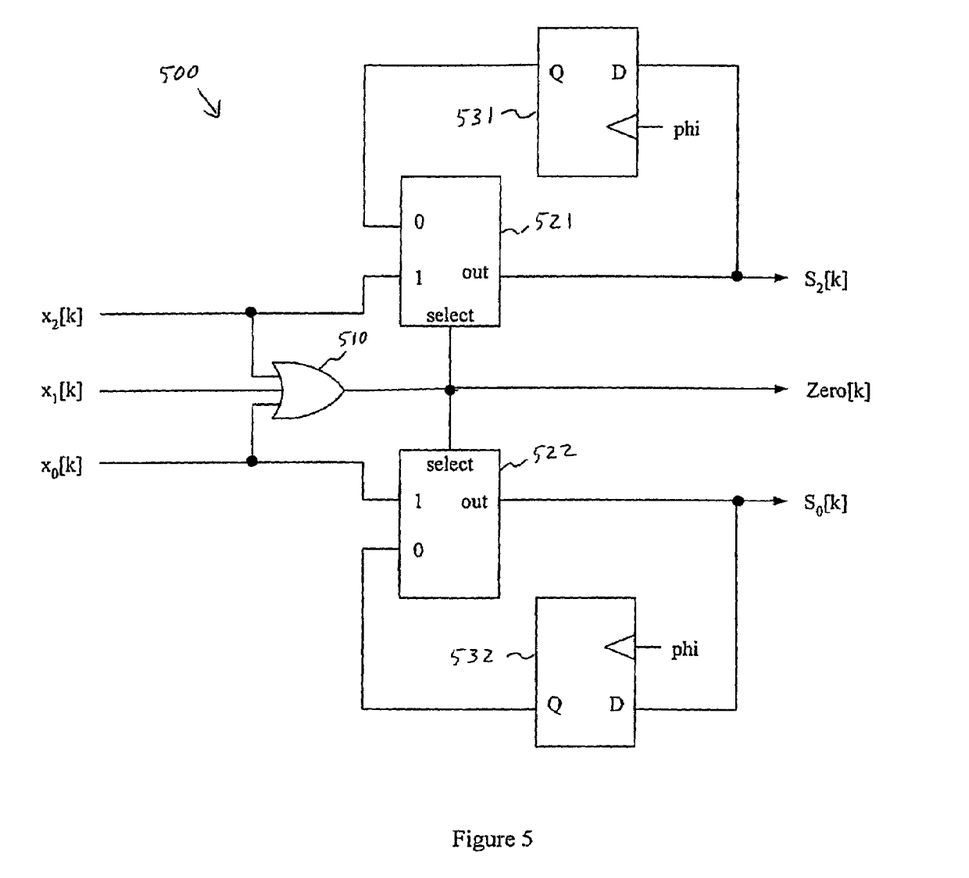
FIG. 5 is a diagram illustrating aspects of a switching-activity-reducing pre-coding stage in accordance with various aspects of the present invention.

Refer now to FIG. 5, which is a diagram illustrating an exemplary reduced-switching digital signal processing circuit 500 in accordance with various aspects of the present invention. Through logical decision-making based on the anticipated behavior of subsequent digital signal processing circuitry, the reduced-switching digital signal processing circuit 500 sets its output signals, in part, to reduce the amount of unnecessary switching in the subsequent digital signal processing circuitry. The reduced-switching digital signal processing circuit 500 may, for example, be used to implement the precoder 210 in the FIR filter 200 illustrated in FIG. 2. FIG. 5 illustrates a reduced-switching digital signal processing circuit 500 as an improved multiplication circuit precoder 500 according to various aspects of the present invention. However, the scope of the present invention is by no means limited to multiplication circuits, FIR filters, or precoders therefore. The exemplary reduced-switching precoder 500 illustrated in FIG. 5 implements the truth table shown below in Table 2.

TABLE 2

Precode Logic Truth Table for 5-Level Symbol Code with Reduced Switching Activity

| Symbol $x[k]$ (decimal) | Symbol "$x[k]$" (two's complement $[x_2, x_1, x_0]$) | Code $S_2[k]$ ($x_2$) | Code Zero[k] ($x_0$ or $x_1$ or $x_2$) | Code $S_0[k]$ ($x_0$) |
|---|---|---|---|---|
| −2 | 110 | 1 | 1 | 0 |
| −1 | 111 | 1 | 1 | 1 |
| 0 | 000 | $S_2[k-1]$ | 0 | $S_0[k-1]$ |
| 1 | 001 | 0 | 1 | 1 |
| 2 | 010 | 0 | 1 | 0 |

Similar to the codes in Table 1, the codes in Table 2 are related to the following signal processing mathematical operations in the exemplary subsequent digital signal processing circuit:

$S_2[k]$: If $S_2=1$, generate the one's complement;
Zero[k]: If Zero=0, zero the result; and
$S_0[k]$: If $S_0=0$, shift left one bit.

The contents of Table 2 are also similar to Table 1, with two notable exceptions. In the Table 2 row corresponding to the input situation where signal $x[k]$ is 0, signal Zero[k] is set to zero. In the chosen example, where the circuit subsequent to the precoder 500 is similar to the multiplier circuit 400 illustrated in FIG. 4, a code of Zero[k]=0 causes the multiplier circuit to zero its output. Accordingly, the $S_2$ and $S_0$ signals output from the precoder 500 to the subsequent circuit will result in unnecessary switching in the subsequent circuit if the values of $S_2$ and $S_0$ differ from their previous values. To eliminate this unnecessary switching, in the event that the input "x" results in an output Zero[k]=0, the output values for $S_2$ and $S_0$ are held to their previous values. Namely, $S_2[k]=S_2[k-1]$, and $S_0[k]=S_0[k-1]$. The general equations are as follows:

$Zero[k]=(x_2[k]$ OR $x_1[k]$ OR $x_0[k])$;  Equation 1:

$S_2[k]=x_2[k]$ if $Zero[k]=1$; else $S_2[k]=S_2[k-1]$; and  Equation 2:

$S_0[k]=x_0[k]$ if $Zero[k]=1$; else $S_0[k]=S_0[k-1]$.  Equation 3:

Referring again to FIG. 5, the exemplary precoder 500 receives a 3-bit number "x" represented by bits $[x_2\ x_1\ x_0]$. The precoder 500 includes an OR gate 510, which implements Equation 1. The OR gate 510 receives each of the bits $x_2[k]$, $x_1[k]$ and $x_0[k]$ as inputs and outputs the symbol Zero[k] as the logical OR of bits $x_2[k]$, $x_1[k]$ and $x_0[k]$. The precoder 500 outputs the symbol Zero[k] to subsequent circuitry. The precoder 500 also utilizes the symbol Zero[k] internally to implement Equation 2 for $S_2[k]$ and Equation 3 for $S_0[k]$.

Regarding Equation 2, the precoder 500 receives bit $x_2[k]$ into input 1 of a first multiplexer 521. The output of the first multiplexer 521, which is symbol $S_2$, drives the D input of a first D flip-flop 531. The first D flip-flop 531 receives a clock signal phi that clocks the value of symbol $S_2$ into the first D flip-flop 531, which in turn outputs the value of symbol $S_2$ on output Q. The output Q of the first D flip-flop 531 drives input 0 of the first multiplexer 521. Note that the D flip-flop 531 may be readily replaced by any suitable memory circuit.

The timing of the clock signal phi is such that the clock signal phi clocks the value of symbol $S_2$ into the first D flip-flop 531 prior to the arrival of a next input "x" at the precoder 500. Thus, as the precoder 500 determines the value of output symbol $S_2[k]$, the first D flip-flop 531 has the prior value of symbol $S_2$, namely $S_2[k-1]$, clocked into it. Accordingly, when the precoder 500 is determining the value of output symbol $S_2[k]$, the signals present at the inputs of the first multiplexer 521 are $x_2[k]$ at input 1 and $S_2[k-1]$ at input 0.

The output of the OR gate 510, which is symbol Zero[k], drives the select input of the first multiplexer 521. Thus, when Zero[k] is "0," the first multiplexer 521 outputs $S_2[k]=S_2[k-1]$, and when Zero[k] is 1, the first multiplexer 521 outputs $S_2[k]=x_2[k]$. This is in accordance with Equation 2.

Regarding Equation 3, the precoder 500 receives bit $x_0[k]$ into input 1 of a second multiplexer 522. The output of the second multiplexer 522, which is symbol $S_0$, drives the D input of a second D flip-flop 532. The second D flip-flop 532 receives a clock signal phi that clocks the value of symbol $S_0$ into the second D flip-flop 532, which in turn outputs the value of symbol $S_0$ on output Q. The output Q of the second D flip-flop 532 drives input 0 of the second multiplexer 522.

The timing of the clock signal phi is such that the clock signal phi clocks the value of symbol $S_0$ into the second D flip-flop 532 prior to the arrival of a next input "x" at the precoder 500. Thus, as the precoder 500 determines the value of output symbol $S_0[k]$, the second D flip-flop 532 has the prior value of symbol $S_0$, namely $S_0[k-1]$, clocked into it. Accordingly, when the precoder 500 is determining the value of output symbol $S_0[k]$, the signals present at the inputs of the second multiplexer 522 are $x_0[k]$ at input 1 and $S_0[k-1]$ at input 0.

The output of the OR gate 510, which is symbol Zero[k], drives the select input of the second multiplexer 522. Thus, when Zero[k] is 0, the second multiplexer 532 outputs $S_0[k]=S_0[k-1]$, and when Zero[k] is 1, the second multiplexer 532 outputs $S_0[k]=x_0[k]$. This is in accordance with Equation 3.

Note that the exemplary precoder 500, and numerous circuit embodiments of various aspects of the present invention, may be implemented, for example, in a single integrated circuit or using discrete electrical components. In addition, the exemplary precoder 500, and numerous circuit embodiments of various aspects of the present invention, may be implemented, for example, with a processor executing instructions that simulate the operation of discrete electrical components or an integrated circuit.

Coupling the exemplary precoder 500 illustrated in FIG. 5 to the multiplier circuit 400 results in a substantial reduction in unnecessary switching and also results in the proper magnitude output from the multiplier circuit 400. However, since the precoder 500 may set symbol $S_2[k]$ to $S_2[k-1]$ when Zero[k] is 0, the output sign bit 490 of the multiplier circuit 400 may be in an improper state.

In the original truth table shown in Table 1, the signal Zero[k] could only have a value of "0" when the value of $S_2[k]$ output to the multiplier circuit 400 was also "0." Accordingly, when the signal Zero[k] forces the outputs of the AND gates 471–473 to 0, the output sign bit 490, which is $S_2[k]$, is also 0. However, in the modified truth table shown in Table 2, when signal Zero[k] is 0, the value of $S_2[k]$ arriving at the multiplier circuit 400 is set to $S_2[k-1]$, which may have a value of "1." Therefore, the situation could arise where signal Zero[k] drives the magnitude outputs from the AND gates 471–473 to "0" and yet the value of the output sign bit is "1." FIG. 6 illustrates an aspect of the present invention that addresses this issue.

Figure 6:
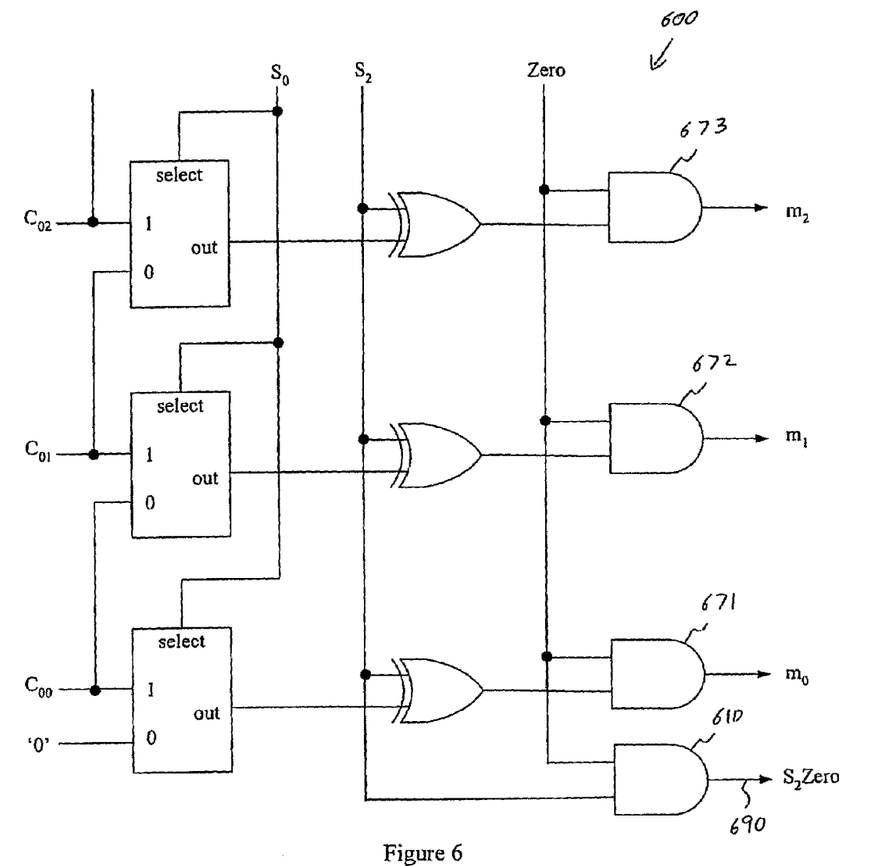
FIG. 6 is a diagram illustrating aspects of mathematical computation circuitry such as, for example, may accompany the switching-activity-reducing pre-coding stage illustrated in FIG. 6, in accordance with various aspects of the present invention.

FIG. 6 is a diagram illustrating aspects of digital signal processing circuitry 600 such as, for example, may accompany the exemplary reduced-switching precoder circuit 500 illustrated in FIG. 5, in accordance with various aspects of the present invention. The exemplary digital signal processing circuitry 600 shown in FIG. 6 is a multiplier circuit 600, which is similar to the multiplier 400 shown in FIG. 4, with at least one significant difference. The multiplier circuit 600 includes a sign AND gate 610 that receives signals $S_2$ and Zero as inputs. The sign AND gate 610 provides for the Zero signal to zero the output sign bit 690 in the same manner as the Zero signal zeros the multiplier magnitude outputs $[m_0\ m_1\ m_2]$ output from the first, second and third AND gates 671–673 of the magnitude-zeroing sub-circuit. The sign AND gate 610 thus serves as a sign-zeroing sub-circuit for the multiplier circuit 600.

Note that the exemplary digital signal processing circuitry 600, and numerous circuit embodiments of various aspects of the present invention, may be implemented, for example, in a single integrated circuit or using discrete electrical components. In addition, the exemplary digital signal processing circuitry 600, and numerous circuit embodiments of various aspects of the present invention, may be implemented, for example, with a processor executing instructions that simulate the operation of discrete electrical components or an integrated circuit.

Figure 7:
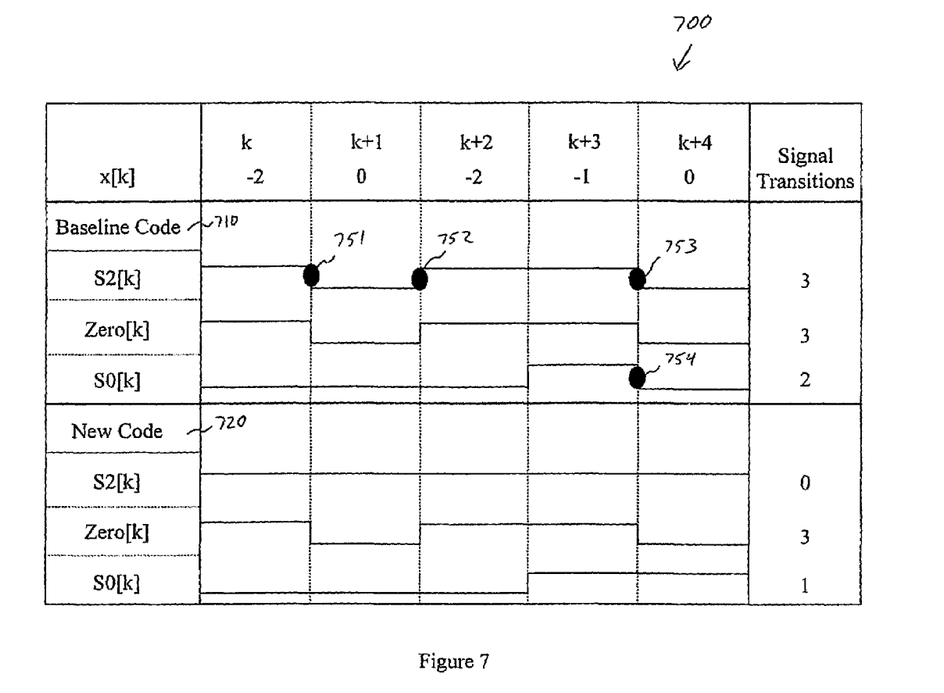
FIG. 7 is a diagram illustrating an example of switching activity reduction in accordance with various aspects of the present invention.

Refer now to FIG. 7 for an illustration 700 of the exemplary advantages resulting from aspects of the present invention. FIG. 7 is a diagram 700 illustrating a example of switching activity reduction in accordance with various aspects of the present invention. The columns of the table represent a sequence of exemplary input signal values of x[k], namely [−2, 0, −2, −1, 0], input into an exemplary precoder circuit, such as illustrated in FIG. 5. The rows in the upper half 710 of the table 700 represent coded $S_2[k]$, Zero[k] and $S_0[k]$ signals resulting from an exemplary baseline precoder circuit. The rows in the lower half 720 of the table 700 represent coded $S_2[k]$, Zero[k] and $S_0[k]$ signals resulting from an exemplary precoder circuit that supports switching reduction according to various aspects of the present invention.

The far right column 730 of the table represents the number of transitions in each of the $S_2[k]$, Zero[k] and $S_0[k]$ signals resulting from the input sequence x[k]. As illustrated, the input sequence x[k] results in 8 total switch transitions (3+3+2) for the exemplary baseline precoder circuit. For comparison, the input sequence x[k] results in 4 total switch transitions (0+3+1) for the exemplary precoder circuit incorporating aspects of the present invention. The table graphically illustrates four signal transitions 751–754 that occurred in the baseline precoder circuit that did not occur in the exemplary baseline precoder circuit. Therefore, for the example illustrated in FIG. 7, a precoder circuit implementing switching reduction in accordance with various aspects of the present invention may, for example, achieve a 2-to-1 reduction in signal switching activity, which in turn results in a substantial reduction in unnecessary logic circuit switching in subsequent digital signal processing circuitry that operates on the $S_2[k]$, Zero[k] and $S_0[k]$ signals output from the precoder circuit.

TABLE 3

Exemplary Switching Probability Simulation

| Precoder Output Signal | Average Value | Switching Probability |
|---|---|---|
| $S_2[k]_{baseline}$ | 0.4 | 0.478 |
| $Zero[k]_{baseline}$ | 0.8 | 0.317 |
| $S_0[k]_{baseline}$ | 0.4 | 0.479 |
| $S_2[k]_{switching\ activity\ reduced}$ | 0.5 | 0.399 |
| $Zero[k]_{switching\ activity\ reduced}$ | 0.8 | 0.317 |
| $S_0[k]_{switching\ activity\ reduced}$ | 0.5 | 0.400 |

As a further illustration of the switching reduction that may be accomplished by utilizing aspects of the present invention, refer to Table 3. Table 3 illustrates the results of a simulation of 100,000 symbols x[k] input into exemplary precoder circuits. Column 1 labels the code signals output from two exemplary precoders, namely code signals $S_2[k]$, Zero[k] and $S_0[k]$ from a baseline precoder and $S_2[k]$, Zero[k] and $S_0[k]$ from an exemplary precoder implementing switching activity reduction in accordance with various aspects of the present invention. Column 2 shows the average value for the code signals output from the simulated precoders. Column 3 shows the probability that the code signals output from the simulated precoders will switch for a given input symbol change.

For comparison, the upper rows of Table 3, rows 2–4, illustrate coded signals output from the exemplary baseline precoder, and the lower rows of Table 3, rows 5–7, illustrate coded signals output from an exemplary precoder implementing various aspects of the present invention. For example, the probability that the coded signal $S_2[k]$ will switch logic values for a given input value x[k] is 0.478 for the baseline precoder and 0.399 for an exemplary precoder implementing switching activity reduction in accordance with various aspects of the present invention. Also, the probability that the coded signal $S_0[k]$ will switch logic values for a given input value x[k] is 0.479 for the baseline precoder and 0.400 for the exemplary precoder implementing switching activity reduction in accordance with various aspects of the present invention. In summary, Table 3 illustrates an expected switching activity reduction of approximately 16.5% for the coded signals $S_2[k]$ and $S_0[k]$ output from the exemplary precoder implementing switching activity reduction in accordance with various aspects of the present invention.

The previous examples focused on a precoder and multiplier circuit implementing various aspects of the present invention. As mentioned previously, the precoder and multiplier examples are merely examples chosen for illustrative purposes. The scope of the present invention is by no means limited to precoder circuits, multiplier circuits, FIR filter circuits, or any other type of particular digital circuit. To illustrate this point more clearly, refer to FIG. 8, for example, which is a diagram illustrating a system 800 for reducing power consumption in digital circuitry by reducing the amount of unnecessary switching in such circuitry in accordance with various aspects of the present invention.

Figure 8:
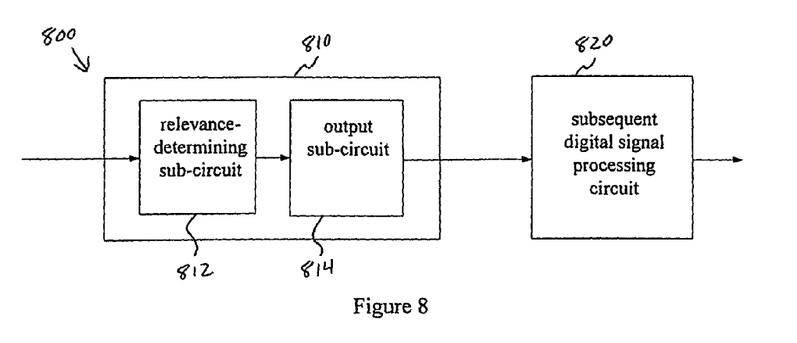
FIG. 8 is a diagram illustrating a system for reducing power consumption in digital signal processing circuitry by reducing the amount of unnecessary switching in such circuitry in accordance with various aspects of the present invention.

The system 800 includes a switching-reduction circuit 810 and a subsequent digital signal processing circuit 820 (subsequent DSPC). The precoder 500 illustrated in FIG. 5 is but one example of such a switching-reduction circuit 810, and the multiplier circuit 600 illustrated in FIG. 6 is but one example of such a subsequent digital signal processing circuit 820.

The switching-reduction circuit 810 determines, based on anticipated behavior of the subsequent DSPC 820, whether a next signal input will be relevant to the next output of the subsequent DSPC 820. In other words, the switching-reduction circuit 810 determines whether the next input signal matters to the subsequent DSPC 820 for its next output. If the switching-reduction circuit 810 determines that the next input signal may be relevant to the next output of the subsequent DSPC 820, the switching-reduction circuit 810 outputs the next input signal to the subsequent DSPC 820. Conversely, if the switching-reduction circuit 810 determines that the next input signal will not be relevant to the next output of the subsequent DSPC 820, the switching-reduction circuit 810, to reduce unnecessary switching in the subsequent DSPC 820, may output again the previous signal that the switching-reduction circuit 810 was providing to the subsequent DSPC 820 when the next input signal arrived.

For example, assume the switching-reduction circuit 810 was outputting a signal with a logic value of "1" to the subsequent DSPC 820 when a next input signal with a logic value of "0" arrives at the switching-reduction circuit 810. Also assume that the switching-reduction circuit 810 determines that the next input signal, if output to the subsequent DSPC 820, would have no bearing on the next output of the subsequent DSPC 820 (e.g., some other signal or state is expected to completely dictate the next output of the DSPC 820). In this case, outputting the logic "1" signal to the subsequent DSPC 820, which was receiving a logic "0" signal, would result in switching activity in the DSPC 820 that is of no value to the next output of the DSPC 820. Accordingly, the switching-reduction circuit 810 will decide to again output the previous logic "0" signal to the DSPC 820 rather than the new logic "1" signal.

The switching-reduction circuit 810 may include, for example, a logic circuit 812 (or relevance-determining sub-circuit) that determines the relevance of the next input signal to the next output of the subsequent DSPC 820. The logic circuit may, for example, determine the relevance of the next input signal based on knowledge of the configuration of the subsequent DSPC 820, and perhaps also on knowledge of other input signals to the subsequent DSPC 820 and/or the current state of the subsequent DSPC 820. The logic circuit 812 may then, in turn, drive an output circuit 814 to output the appropriate signal to the DSPC 820. An example of such a logic circuit 812 was presented earlier in the discussion of FIG. 5. Note, however, that this was just an example, and various other circuit configurations may provide similar relevance-determining functionality.

The output circuit 814 may include, for example, a multiplexer having multiple inputs, an output, and an input-select input. The next input signal may drive one of the multiplexer inputs. The current output signal from the multiplexer, or a copy thereof, may drive another of the multiplexer inputs. For example, the current output signal of the multiplexer may be coupled to an input of the multiplexer with a memory device in a feedback loop. Further, an output from the logic circuit 812 may drive the input-select input of the multiplexer, thereby controlling the next output of the output circuit 814. An example of such a multiplexer configuration was presented earlier in the discussion of FIG. 5. Note, however, that this was just an example, and various other circuit configurations may provide similar output functionality.

Figure 9:
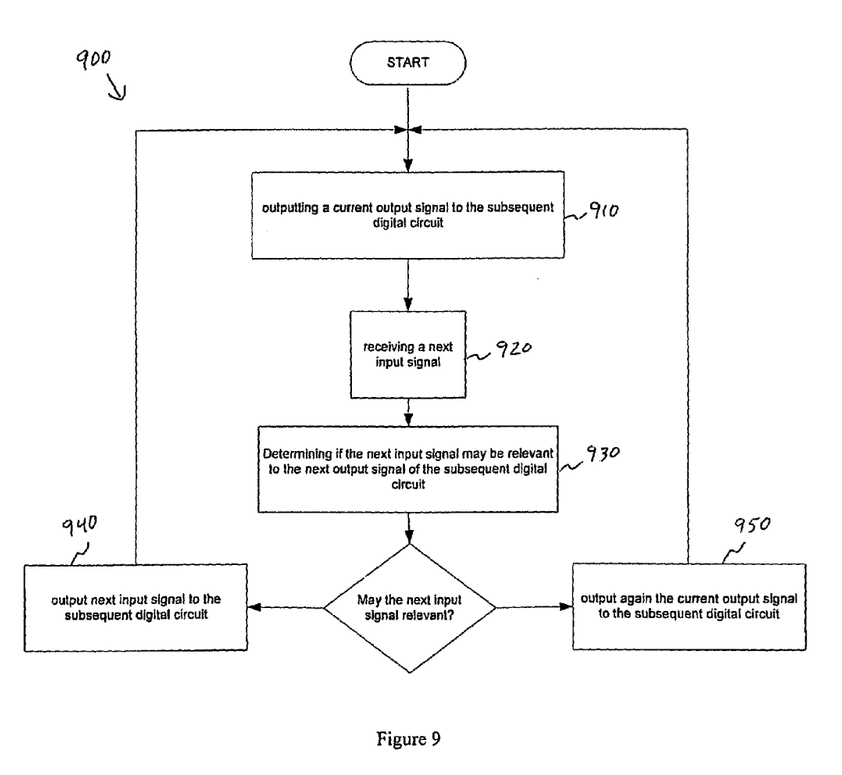
FIG. 9 is a diagram illustrating a method for reducing power consumption in digital signal processing circuitry by reducing the amount of unnecessary switching in such circuitry in accordance with various aspects of the present invention.

For still further examples of aspects of the present invention, refer now to FIG. 9, which is a diagram 900 illustrating a method for reducing power in digital circuitry by reducing the amount of unnecessary switching in such circuitry in accordance with various aspects of the present invention. The method includes, in step 910, outputting a current output signal to subsequent digital circuitry. The current output signal may, for example, be in response to a current input signal. The method then includes, in step 920, receiving a next input signal. After receiving the next input signal, the method includes, in step 930, determining if the next input signal may be relevant to the next output of the subsequent digital circuit.

The determining step 930 may include, for example, determining the relevance of the next input signal based on anticipated behavior of the subsequent digital circuit. The determining step 930 may include, for example, determining the relevance of the next input signal based in-part on the values of other input signals to the subsequent digital circuit or on a known state of the subsequent digital circuit. For example, the determining step 930 may include determining that an input signal other than the next input signal to the subsequent digital circuit will cause the next output of the subsequent digital circuit to have a value of "0" regardless of the value of the next input signal.

Also, for example, consider a Booth-type multiplier circuit having a precoder stage and a multiplier stage. An aspect of the present invention may include determining that the precoder stage is outputting a zeroing signal to the multiplier stage and thereby determining that the $S_2$ and $S_0$ signals output to the multiplier stage are irrelevant to the next output of the multiplier stage.

If the next input signal may be relevant to the next output of the subsequent digital circuit, the method includes, in step 940, outputting the next input signal to the subsequent digital circuit. If, however, the next input signal is not relevant to the next output of the subsequent digital circuit, the method includes, in step 950, outputting again the current output signal to the subsequent digital circuitry instead of the next input signal.

Note that the method 900 illustrated in FIG. 9, and variants thereof, may be performed in a variety of hardware and software configurations. For example, the method 900 may be performed entirely by circuitry on a single integrated circuit. Alternatively, the method 900 may, for example, be performed by a processor executing software instructions. The specific implementation of the method 900, and variants thereof, depends on the design goals for the specific implementation of the method 900.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A reduced-switching multiplier circuit comprising:
a first sub-circuit; and
a second sub-circuit coupled to the first sub-circuit, the second sub-circuit receiving an input signal, the second sub-circuit outputting the input signal to the first sub-circuit when the input signal may be relevant to a next output of the first sub-circuit, and the second sub-circuit outputting a previous second sub-circuit output signal to the first sub-circuit when the input signal will not be relevant to the next output of the first sub-circuit.

2. The reduced-switching multiplier circuit of claim 1, wherein the second sub-circuit comprises:
an output circuit; and
a logic circuit controllably coupled to the output circuit, the logic circuit having a first output state when the input signal may be relevant to the next output of the first sub-circuit, and the logic circuit having a second output state when the input signal will not be relevant to the next output of the first sub-circuit.

3. The reduced-switching multiplier circuit of claim 2, wherein an output of the output circuit is coupled to an input of the output circuit.

4. The reduced-switching multiplier circuit of claim 1, wherein the second sub-circuit comprises a multiplexer, a first input of the multiplexer coupled to an output of the multiplexer, and a second input of the multiplexer coupled to the input signal.

5. The reduced-switching multiplier circuit of claim 1, wherein the second sub-circuit comprises:
a multiplexer having a first input, a second input, a select input and an output, the multiplexer output coupled to the multiplexer first input, and the multiplexer second input coupled to the input signal; and
a logic circuit having an input and an output, the logic circuit input coupled to the input signal, and the logic circuit output coupled to the multiplexer select input.

6. The reduced-switching multiplier circuit of claim 5, wherein the second sub-circuit further comprises a memory sub-circuit, an input of the memory sub-circuit coupled to the multiplexer output, and an output of the memory sub-circuit coupled to the multiplexer first input.

7. The reduced-switching multiplier circuit of claim 5, wherein the logic circuit output comprises a zeroing signal output to the first sub-circuit, and wherein the first sub-circuit comprises:
a magnitude-zeroing sub-circuit having a zero output in response to the zeroing signal; and
a sign-zeroing sub-circuit having a zero output in response to the zeroing signal.

8. The reduced-switching multiplier circuit of claim 1, wherein the first sub-circuit comprises:
a magnitude-zeroing sub-circuit having a zero output in response to a zeroing signal; and
a sign-zeroing sub-circuit having a zero output in response to the zeroing signal.

9. The reduced-switching multiplier circuit of claim 1, wherein the first sub-circuit and second sub-circuit are implemented on a single integrated circuit.

10. A method for reducing unnecessary switching in a subsequent digital circuit, the method comprising:
outputting a current output signal to the subsequent digital circuit;
receiving a next input signal;
determining, based on anticipated behavior of the subsequent digital circuit, whether the next input signal may be relevant to a next output of the subsequent digital circuit;
if the next input signal may be relevant to the next output of the subsequent digital circuit, outputting the next input signal to the subsequent digital circuit; and
if the next input signal will not be relevant to the next output of the subsequent digital circuit, outputting the current output signal to the subsequent digital circuit.

11. The method of claim 10, wherein:
the determining step comprises implementing the determining step with a digital circuit; and
the outputting the current signal step comprises coupling the current output signal from the digital circuit to an input of the digital circuit.

12. The method of claim 10, wherein the determining step comprises determining if a signal other than the next input signal will cause the next output of the subsequent digital circuit to be zero.

13. The method of claim 10, wherein the determining step comprises determining if a current state of the subsequent digital circuit will cause the next output of the subsequent digital circuit to be zero.

14. The method of claim 10, wherein the steps of the method are performed by circuitry in a single integrated circuit.

15. A switching-reduction circuit for reducing unnecessary switching in a subsequent digital signal processing circuit (SDSPC), the switching-reduction circuit comprising:
a first sub-circuit outputting a current output signal to the SDSPC;
a second sub-circuit receiving a next input signal, the second sub-circuit determining, based on anticipated behavior of the SDSPC, whether the next input signal may be relevant to a next output of the SDSPC, the second sub-circuit causing the first sub-circuit to output the next input signal to the SDSPC when the next input signal may be relevant to the next output of the SDSPC, and the second sub-circuit causing the first sub-circuit to output the current output signal to the SDSPC when the next input signal will not be relevant to the next output of the SDSPC.

16. The switching-reduction circuit of claim 15, wherein an output of the first sub-circuit is coupled to an input of the first sub-circuit.

17. The switching-reduction circuit of claim 15, wherein the first sub-circuit comprises a multiplexer having a first input and an output, the multiplexer output coupled to the multiplexer first input.

18. The switching-reduction circuit of claim 15, wherein the first sub-circuit comprises:
a multiplexer comprising a first input, a second input, and an output; and
a memory circuit comprising a memory input coupled to the multiplexer output and a memory output coupled to the multiplexer first input.

19. The switching-reduction circuit of claim 18, wherein the multiplexer further comprises an input-select input coupled to an output of the second sub-circuit.

20. The switching-reduction circuit of claim 15, wherein the first sub-circuit and second sub-circuit are implemented on a single integrated circuit.

21. A finite impulse response filter comprising:
a plurality of taps, each having a respective multiplier circuit; and a precoder circuit providing a current coded signal to the plurality of respective multiplier circuits, the precoder circuit comprising:
- a logic circuit that receives a next input signal and forms a next coded signal in response to the next input signal, the logic circuit having a first output state when the next coded signal may be relevant to next outputs of the plurality of multiplier circuits, and the logic circuit having a second output state when the next coded signal will not be relevant to the next outputs of the plurality of multiplier circuits; and
- an output circuit coupled to the logic circuit, the output circuit outputting the next coded signal to the plurality of multiplier circuits in response to the logic circuit having the first output state, and the output circuit outputting the current coded signal to the plurality of multiplier circuits in response to the logic circuit having the second output state.

22. The finite impulse response filter of claim 21, wherein an output of the output circuit is coupled to an input of the output circuit.

23. The finite impulse response filter of claim 21, wherein the output circuit comprises a memory device having a memory input coupled to an output of the output circuit, and a memory output coupled to an input of the output circuit.

24. The finite impulse response filter of claim 21, wherein the output circuit comprises a multiplexer comprising:
- a first multiplexer input coupled to the next coded signal; and
- a second multiplexer input coupled to the current coded signal.

25. The finite impulse response filter of claim 21, wherein the output circuit comprises a multiplexer comprising:
- a multiplexer output;
- a first multiplexer input coupled to the next coded signal;
- a second multiplexer input coupled to the multiplexer output; and
- a select input coupled to the logic circuit.

26. The finite impulse response filter of claim 25, wherein the output circuit further comprises a memory device having a memory input coupled to the multiplexer output, and a memory output coupled to the second multiplexer input.

27. The finite impulse response filter of claim 21, wherein at least one of the multiplier circuits comprises:
- a magnitude-zeroing sub-circuit having a zero magnitude output in response to the logic circuit having the second output state; and
- a sign-zeroing sub-circuit having a zero sign output in response to the logic circuit having the second output state.

28. The finite impulse response filter of claim 21, wherein the precoder circuit is implemented on an integrated circuit.

29. A method for reducing power consumption in a Booth-type multiplier circuit having a pre-coder stage and a multiplier stage, the method comprising:
- determining if the next input to the multiplier stage from the pre-coder stage will include a zeroing signal to zero the magnitude output of the multiplier stage; and
- if the next input to the multiplier circuit will include a zeroing signal to zero the magnitude output of the multiplier stage, outputting the zeroing signal to the multiplier stage and maintaining at least one other input signal to the multiplier stage at its current value.

30. The method of claim 29, further comprising setting a sign bit output from the multiplier stage to a zero value if the next input to the multiplier stage includes the zeroing signal.

* * * * *